United States Patent [19]

Chen et al.

[11] Patent Number: 5,893,738

[45] Date of Patent: Apr. 13, 1999

[54] METHOD FOR FORMING DOUBLE DENSITY MROM ARRAY STRUCTURE

[75] Inventors: Chung-Ju Chen; Mam-Tsung Wang, both of Hsin-chu, Taiwan

[73] Assignee: Macronix International Co., Ltd., Hsinchu, Taiwan

[21] Appl. No.: 08/968,632

[22] Filed: Nov. 12, 1997

Related U.S. Application Data

[62] Division of application No. 08/825,820, Mar. 28, 1997, Pat. No. 5,828,113.

[51] Int. Cl.⁶ .................................................. H01L 21/8246
[52] U.S. Cl. ........................................ 438/275; 438/276
[58] Field of Search ............................... 438/275–278; 257/390–391

[56] References Cited

U.S. PATENT DOCUMENTS

5,490,106  2/1996  Tasaka .................................. 365/182
5,585,296  12/1996  Chung et al. ........................ 438/275
5,691,216  11/1997  Yen et al. ............................. 438/275

*Primary Examiner*—Jey Tsai
*Attorney, Agent, or Firm*—Mark A. Haynes; Wilson Sonsini, Goodrich & Rosati

[57] ABSTRACT

A semiconductor mask-programmable read-only-memory array structure provides double density storage of data information by means of thin film memory cell transistors formed on both sides of a layer of thin film polysilicon. At a bottom surface of a layer of thin film polysilicon which has a bottom gate oxide grown thereon, a plurality of polysilicon bottom cell wordlines intersects a plurality of bitlines to form an array of bottom cell memory transistors. The bitlines are heavily-doped diffusion regions within the layer thin film polysilicon. Additionally, a top surface of the layer of thin film polysilicon has a top gate oxide grown thereon. Over this top gate oxide, a plurality of polysilicon top cell wordlines intersects the plurality of bitlines to form an array of top cell memory transistors, thereby producing a NOR-type read-only-memory array structure with double the storage density of conventional, prior art structures.

9 Claims, 9 Drawing Sheets

FIG. 1

*(Prior Art)*

METHOD FOR FORMING DOUBLE DENSITY MROM ARRAY STRUCTURE

This application is a divisional of application Ser. No. 08/825,820, filed Mar. 28, 1997, U.S. Pat. No. 5,828,113.

FIELD OF THE INVENTION

The present invention relates to a read-only-memory device for storing data information. More particularly, the present invention relates to a semiconductor NOR-type, mask-programmable read-only-memory array structure for storing data information in very high density.

BACKGROUND OF THE INVENTION

In general, read-only-memories (hereinafter referred to as ROMs) are used for storing data information in a permanent, non-volatile form. Semiconductor ROMs find particular application in digital electronic equipment such as computers, office equipment, and game machines where they are used to store permanent data information. Such permanent data information includes control microprograms, electronic games, printer fonts, etc. With the continuing advances in digital electronics and the corresponding need for larger quantities of data information, the demand for cheaper and higher capacity ROMs is growing.

Semiconductor ROMs generally store their data information in arrays of memory cells, wherein each memory cell is a single transistor. The data bits held by the memory cell transistors are permanently stored in the physical or electrical properties of the individual memory cell transistors. For example, in a typical ROM wherein the memory cell transistors are MOSFETs (metal-oxide-semiconductor field effect transistors), memory cell transistors having a first threshold voltage store data bits of value "0" whereas memory cell transistors having a second threshold voltage different from the first threshold voltage store data bits of value "1".

Semiconductor ROMs are generally formed by intersecting a plurality of bitlines which have been diffused into a semiconductor substrate with a plurality of wordlines lying over the substrate. The wordlines are physically separated from the bitlines and the substrate by a thin gate oxide layer such that an array of memory cell MOSFET transistors is formed. In the array, the wordlines serve as gates for the memory cell transistors while the bitlines serve as source and drain diffusion regions. Then, by properly adjusting the dopant concentrations of the channel regions of the individual memory cell transistors, the memory cell transistors are programmed to exhibit the threshold voltages corresponding to the data bits they store.

In the case of mask-programmable read-only-memories (or, alternatively, mask ROMs or simply MROMs), the coding of the data bits onto the memory cell transistors is generally performed by implanting ions into the channel regions of the appropriate memory cell transistors, thereby adjusting their threshold voltages. This step of coding the data into the ROM array structure through ion implantation is performed using a code mask which permits the implantation of ions into only certain regions (the desired memory cell transistor channel regions) of the semiconductor. The use of a code mask leads to the name mask ROM. Mask ROMs are particularly useful because they can be partially manufactured and stored without being programmed. Some time later, they can be programmed using an ion implantation mask that is custom-made for a particular application. After the programming step, only a few post-processing steps are needed before delivering the custom-programmed MROMs to a customer.

Figure 1:
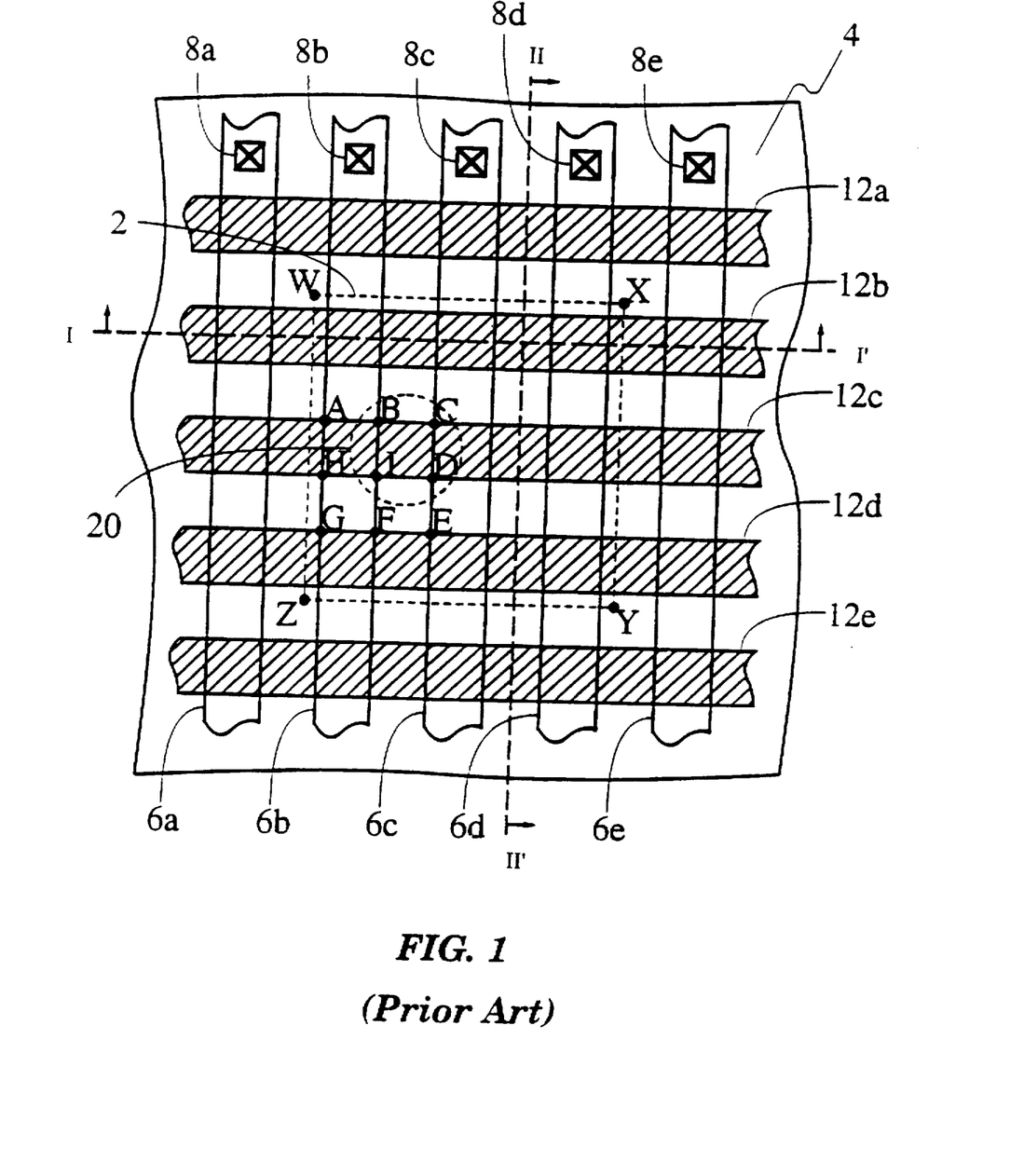
FIG. 1 is a simplified, two-dimensional overhead layout schematic view of a conventional MROM array structure according to the prior art.

FIG. 1 is a simplified, two-dimensional overhead layout schematic view of a portion of a typical MROM array structure according to the prior art. This MROM array structure includes a substantially rectangular sub-region 2 with vertices W, X, Y, and Z. A three-dimensional cut-out view of sub-region 2 is shown in FIG. 2 to more clearly illustrate this prior art MROM array structure.

The prior art MROM array structure of FIG. 1 and FIG. 2 implements a NOR-type ROM (as will be described below). It is called a flat cell and is described in "Symposium on VLSI Circuits", 1988, pp. 85–86. The prior art MROM array structure comprises a semiconductor substrate 4 of a first conductivity type which is typically, but not necessarily, p-type. The structure also comprises a plurality of substantially parallel, elongated, conductive regions 6 formed on the top surface of substrate 4. These conductive regions 6 are called bitlines and are diffusion regions of a second conductivity type, typically n-type. The prior art MROM array structure further comprises metal-to-diffusion contacts 8 which electrically connect bitlines 6 to metal bitlines 10. For simplicity and in order to better illustrate the prior art MROM array structure, metal bitlines 10 are not shown in FIG. 1 or FIG. 2.

Figure 2:
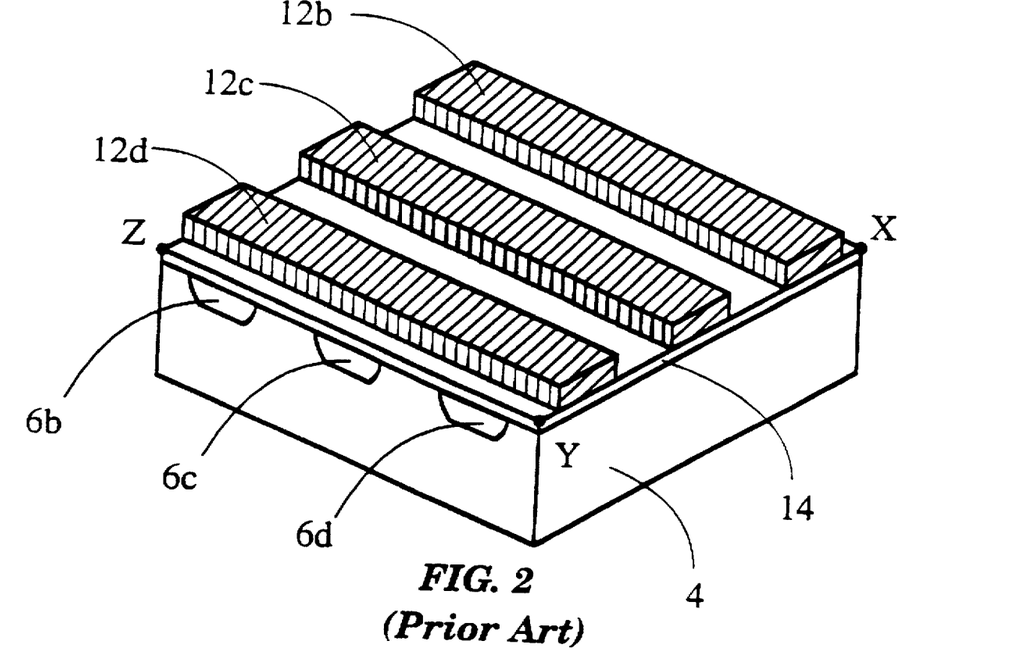
FIG. 2 is a simplified, three-dimensional cut-out schematic view of a sub-region of the conventional MROM array structure of FIG. 1 according to the prior art.

The prior art MROM array structure of FIG. 1 and FIG. 2 further comprises a plurality of substantially parallel, elongated, conductive polysilicon strips 12. These polysilicon strips 12 are called wordlines, and they cross over bitlines 6 at substantially right angles. Each of the bitlines 6 are physically and electrically isolated from each of the wordlines 12 by a gate dielectric 14. Additionally, wordlines 12 are physically and electrically separated from each other by a field dielectric 16, and an insulation layer 18 physically and electrically isolates metal bitlines 10 from wordlines 12. For simplicity, gate dielectric 14, field dielectric 16, and insulation layer 18 are not shown in FIG. 1. Additionally, gate dielectric 14, field dielectric 16, and insulation layer 18 are typically of silicon dioxide, $SiO_2$, hereinafter referred to as oxide.

In the prior art MROM array structure of FIG. 1 and FIG. 2, the substrate surface regions directly underneath a wordline and between any two bitlines form channel regions of memory cell MOSFET transistors. In FIG. 1, one such memory cell transistor 20 has a channel region indicated by the rectangle with vertices B, C, D, and I. The channel region of memory cell transistor 20 is formed on the surface of substrate 4 between bitline 6b and bitline 6c, directly below wordline 12c. In this way, an array of MOSFET memory cell transistors is formed with wordlines 12 serving as gate electrodes and bitlines 6 serving as source and drain diffusion regions. In the prior art MROM array structure of FIG. 1 and FIG. 2, the area regarded as a single memory cell unit area is indicated by the rectangular region with vertices A, C, E, and G. However, the actual memory cell transistor that stores the data bit information occupies only the rectangular area with vertices B, C, D, and I.

The prior art MROM array of memory cell transistors is typically placed within a ROM chip along with memory cell access circuitry for accessing the memory cell transistors in the array. The memory cell access circuitry typically includes row (wordline) address decoder and driver circuits, column (bitline) address decoder and driver circuits, bitline sense amplifier circuits, and output buffer circuits. These memory cell access circuits are all well known in the art, and, therefore, will not be described or illustrated herein.

Additionally, although only one metal-to-diffusion contact 8 is shown for each bitline 6, metal-to-diffusion contacts 8 are periodically placed along bitlines 6 in order to provide low-resistance electrical connections from metal bitlines 10 to bitlines 6 to the channels of the memory cell transistors. The placement of the metal-to-diffusion contacts 8 is well known by those skilled in the art.

As mentioned above, the prior art MROM array structure of FIG. 1 and FIG. 2 implements a NOR-type ROM. To describe the electrical operation of such a ROM, reference will be made to FIG. 3 which shows an equivalent circuit diagram of sub-region 2 of the prior art MROM array structure of FIG. 1 and FIG. 2.

Figure 3:
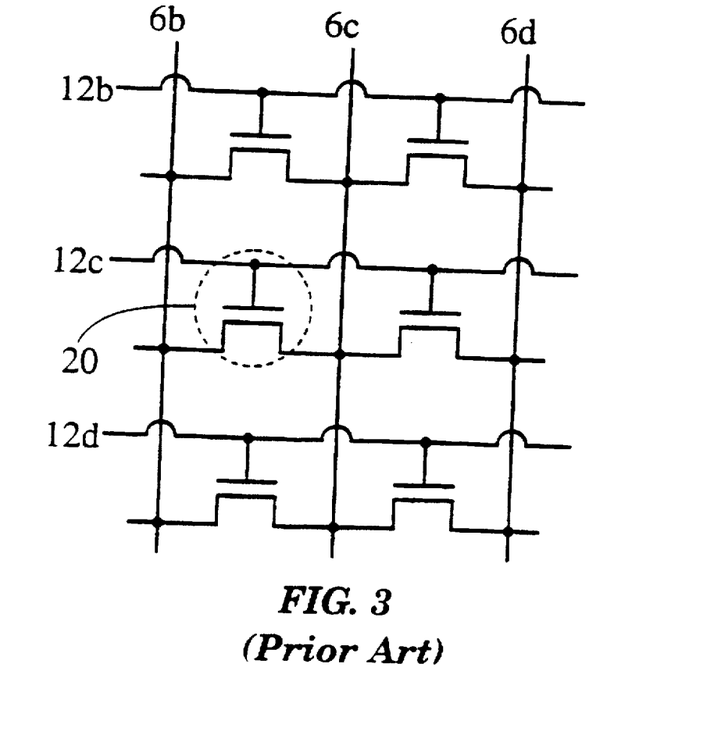
FIG. 3 is a schematic circuit diagram representation of the MROM array structure of FIG. 2 according to the prior art.

Assume that one desires to read out the data bit stored by memory cell transistor 20. To do so, the memory cell access circuitry applies a power source voltage, Vcc, of typically 5 volts to bitline 6b, grounds (applies substantially zero volts to) bitline 6c, and leaves all other bitlines 6 floating (disconnected). Simultaneously, the memory access circuitry applies a read voltage of about 2 volts to wordline 12c while grounding all other wordlines 12. In this way, memory cell transistor 20 is selected (i.e. it is given a gate-to-source voltage of +2 V and an initial drain-to-source voltage of +5 V). If memory cell transistor 20 has not been programmed such that it has a threshold voltage less than 2 volts, the applied voltages will bias it into the active region of operation causing it to turn on and conduct current from bitline 6b to bitline 6c. Sense amplifier circuits electrically connected to bitline 6b through metal-to-diffusion contact 8b and metal bitline 10b will sense the current flow (and the corresponding drop in voltage of bitline 6b) and will drive the output buffer circuits to read out a logic state "1". Similarly, if memory cell transistor 20 has been programmed such that it has a threshold voltage greater than 2 volts, the applied gate-to-source voltage will not be sufficient to bias it into the active region. In this case, memory cell transistor 20 will not turn on or conduct significant current, thus causing the sense amplifier circuits to drive the output buffer circuits to read out a logic state "0". Note that it is equally possible to have the higher threshold voltage represent a logic state "1" and the lower threshold voltage represent a logic state "0".

Figure 4:
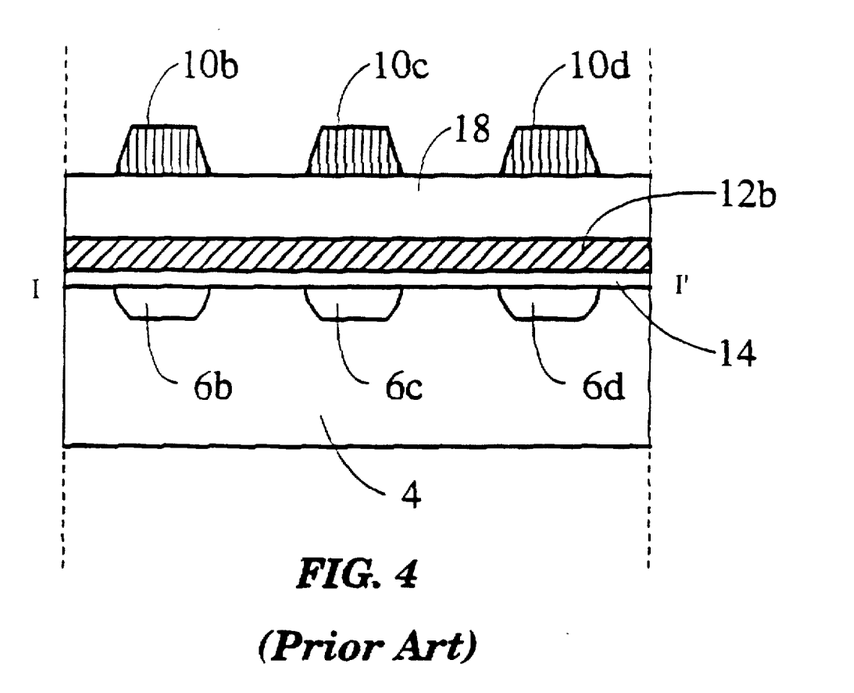
FIG. 4 is a cross-sectional schematic view of a sub-region of the conventional, prior art MROM array structure of FIG. 1 taken along the line a-a'.
Figure 5:
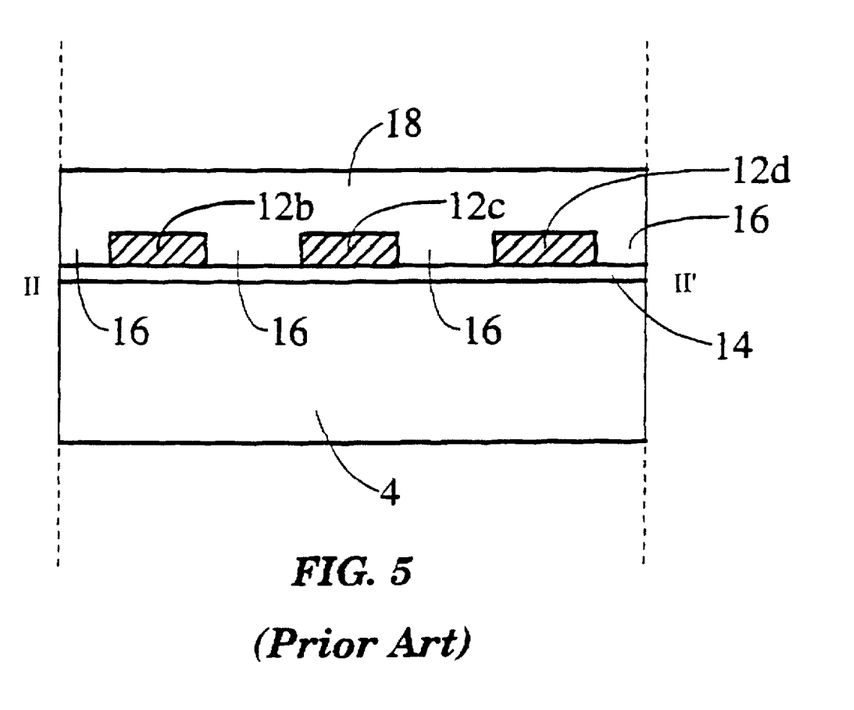
FIG. 5 is a cross-sectional schematic view of a sub-region of the conventional, prior art MROM array structure of FIG. 1 taken along the line b-b'.

FIG. 4 is a cross-sectional view of sub-region 2 of FIG. 1 taken along the line a-a'. Likewise, FIG. 5 is a cross-sectional view of sub-region 2 of FIG. 1 taken along the line b-b'. These two figures will be used to illustrate the following brief description of the manufacturing process of the prior art MROM array structure.

Referring to FIG. 4, on the surface of a semiconductor substrate 4 of a first conductivity type, predetermined active diffusion regions 6 of a second conductivity type are formed to serve as bitlines 6. Over the surface of substrate 4, a gate oxide layer 14, conductive polysilicon wordlines 12, and an insulating oxide layer 18 are successively formed. Finally metal bitlines 10 are deposited over insulating oxide layer 18. Metal bitlines 10 are deposited such that they substantially overlie bitlines 6 when viewed from above.

Referring to FIG. 5, on the surface of a semiconductor substrate 4 of a first conductivity type, a gate oxide layer 14 is formed. Conductive polysilicon is then grown in predetermined regions above gate oxide 14 in order to form wordlines 12. Strips of field oxide 16 and a layer of insulating oxide 18 are then grown between and over wordlines 12, respectively, in order to insulate the individual wordlines from each other and from a metal layer 10.

In order to increase the storage capacity of a conventional, prior art MROM array, it is desirable to reduce the size of the individual memory cells. However, two aspects of the manufacturing process of the prior art MROM array structure limit the degree to which the array structure dimensions can be reduced. The first limitation is the minimum feature size of the particular photolithographic process that is used to fabricate the MROM. The minimum feature size of the photolithographic process may limit one or more of the dimensions in the MROM array structure. For example, the photolithographic minimum feature size may limit the minimum proximity of wordlines 12 to one another, the minimum proximity of metal bitlines 10 to one another, the minimum proximity of bitlines 6 to one other (and thus the length of the memory cell transistor channel regions), the minimum widths of wordlines 12, the minimum widths of metal bitlines 10, or the minimum widths of bitlines 6. Of these, generally the most important is the minimum spacing between adjacent wordlines—the minimum width of field dielectric strips 16. Without advances in the photolithographic process which effectively reduce the minimum feature size, a reduction in the size of the memory cells in the prior art MROM array structure is not possible.

But even if the photolithographic process is improved to allow the minimum feature size to be reduced, there is another practical limitation that prevents the production of prior art MROM array structures of higher density. This practical limitation is a result of the code mask ion implantation step that is performed to program the memory cell transistors. During this step, care must be taken so that dopant ions are implanted only into the channel regions of the appropriate memory cell transistors whose threshold voltages need to be altered in order to hold the correct data information. This requires very precise alignment of the code mask so that adjacent memory cell transistors will not be programmed incorrectly. Since perfect alignment is not possible, some spatial margin between adjacent memory cell transistors must be guaranteed during the code implantation process, thereby limiting the minimum proximity of adjacent memory cells to one another. Additionally, some spatial margin between adjacent memory cell transistors must be allocated for the out-diffusion of ions during the thermal processing steps such as annealing that follow the code ion implantation. This is especially true for boron p-type implantation (to raise the threshold voltage) since boron has a very high constant of diffusivity.

These aspects of the manufacturing process, therefore, limit the minimum dimensions for reliably producing the prior art MROM array structure. This in turn limits the data bit storage density of the MROM. Since the cost of semiconductor devices is directly related to the physical semiconductor area that is used, these process limitations hamper attempts to lower the cost of prior art MROMs through a reduction in the dimensions of the MROM array structure. Additionally, it is difficult to produce higher density MROMs by simply increasing the size of the MROM die because production yield is inversely related to semiconductor area. Thus, these process limitations also hamper attempts to reliably and profitably produce further integrated MROMs with greater storage capacity.

In U.S. Pat. No. 5,200,355, Choi et. al. propose a NOR-type MROM array structure for reducing the proximity of wordlines to one another, thereby decreasing the size of the MROM memory cell area and increasing the integration of the MROM array. The inventors propose a manufacturing method for producing a NOR-type MROM array with wordlines separated by a distance of only by 1000–3000 angstroms, as determined by a nitride layer. Although the method for an MROM array structure disclosed by Choi et.

al. does increase the integration of the MROM array, even further integration of the MROM array into a smaller physical semiconductor area is desired. However, any method for further integration of the MROM array must not subject the array to an increased likelihood of incorrect coding of the data bits into the memory cells during the code mask ion implantation step or during post-processing steps.

OBJECTS AND ADVANTAGES

It is therefore an object of the present invention to provide a NOR-type MROM array structure that overcomes the limitations of the prior art. In particular, it is an object of the present invention to provide for an MROM array structure that allows further integration of an MROM array into a smaller physical semiconductor area.

It is also an object of the present invention to provide a higher density MROM array structure that nonetheless allows the memory cells to be reliably programmed with the desired data bits.

It is a still further object of the present invention to provide an MROM array structure that achieves essentially double the storage density of the conventional, prior art NOR-type MROM array structure.

SUMMARY OF THE INVENTION

Accordingly, the present invention provides for an MROM array structure for storing data information in high density. Furthermore, the present invention provides for an MROM array structure that can be reliably manufactured and programmed without a high risk of incorrect programming the memory cell transistors to store erroneous data bits into.

The preferred embodiment of an MROM array structure according to the present invention comprises: a substrate; an insulation layer covering a top surface of the substrate; a plurality of substantially parallel, elongated, conductive bottom cell wordlines extending over the insulation layer and positioned adjacent to one another at intervals; a plurality of insulation strips positioned between the bottom cell wordlines; a bottom gate dielectric extending over the top surfaces of the bottom cell wordlines and over the top surfaces of the insulation strips; and a layer of thin film polysilicon extending over the bottom gate dielectric. The thin film polysilicon comprises a plurality of substantially parallel, elongated, heavily-doped regions positioned adjacent to one another at intervals. These heavily-doped regions form conductive bitlines which extend substantially perpendicular to the bottom cell wordlines, thereby forming a plurality of bottom cell memory transistors. The bottom cell memory transistors utilize the bottom cell wordlines as gate electrodes, and their channel regions are on the bottom surface of the thin film polysilicon. The MROM array structure of the present invention further comprises a top gate dielectric extending over the top surface of the thin film polysilicon. A plurality of substantially parallel, elongated, conductive top cell wordlines extend over the top gate dielectric. These top cell wordlines are positioned adjacent to one another at intervals, and they extend substantially perpendicular to the bitlines, thereby forming a plurality of top cell memory transistors. The top cell memory transistors utilize the top cell wordlines as gate electrodes, and their channel regions are on the top surface of the thin film polysilicon.

The present invention also provides for a method for fabricating an MROM array structure for storing data information in high density. The method comprises the steps of: forming an insulation layer over a top surface of a substrate; depositing a first layer of polysilicon over the insulation layer; selectively etching the first layer of polysilicon to form a plurality of substantially parallel, elongated, conductive bottom cell wordlines which are positioned adjacent to one another at intervals; growing a plurality of insulation strips between the bottom cell wordlines; etching back the plurality of insulation strips and the plurality of bottom cell wordlines to form a substantially planar surface; growing a bottom gate dielectric over the planar surface; depositing a layer of thin film polysilicon over the bottom gate dielectric; and forming a plurality of substantially parallel, elongated, heavily-doped regions in the thin film polysilicon. These heavily-doped regions are positioned adjacent to one another at intervals, and they form conductive bitlines which extend substantially perpendicular to the bottom cell wordlines, thereby forming a plurality of bottom cell memory transistors. The method further comprises the steps of: depositing a top gate dielectric over the top surface of the thin film polysilicon; depositing a second layer of polysilicon over the top gate dielectric; and selectively etching the second layer of polysilicon to form a plurality of substantially parallel, elongated, conductive top cell wordlines which are positioned adjacent to one another at intervals. These top cell wordlines extend substantially perpendicular to the bitlines, thereby forming a plurality of top cell memory transistors.

BRIEF DESCRIPTION OF THE DRAWINGS

The preferred embodiment of the present invention will be described with reference to the following drawings wherein like numerals refer to like components.

DETAILED DESCRIPTION OF THE PREFERRED EMBODIMENT

The present invention provides for a double-density MROM array structure for reliably storing logic data in a NOR-type semiconductor ROM at very high density. Referring back to FIG. 1, the present invention provides for an MROM array structure which reduces the area of a single memory cell unit. More specifically, the present invention provides for an MROM array structure wherein a single memory cell unit occupies the rectangular area in FIG. 1 with vertices A, C, D, and H. This single memory cell unit area is essentially half the size of the memory cell unit area (rectangle ACEG) of conventional, prior art semiconductor MROM array structures.

Because the MROM array structure of the present invention has multiple layers arranged in three dimensions, several drawings of various views of the preferred embodiment of the MROM array structure according to the present invention will be used in order to properly describe the structure. In all the drawings, like numerals refer to like portions of the structure. Also, not all components of the MROM array structure of the present invention are illustrated in every figure; some layers have been purposely left out from some of the figures to better illustrate the underlying MROM array structure.

Figure 6:
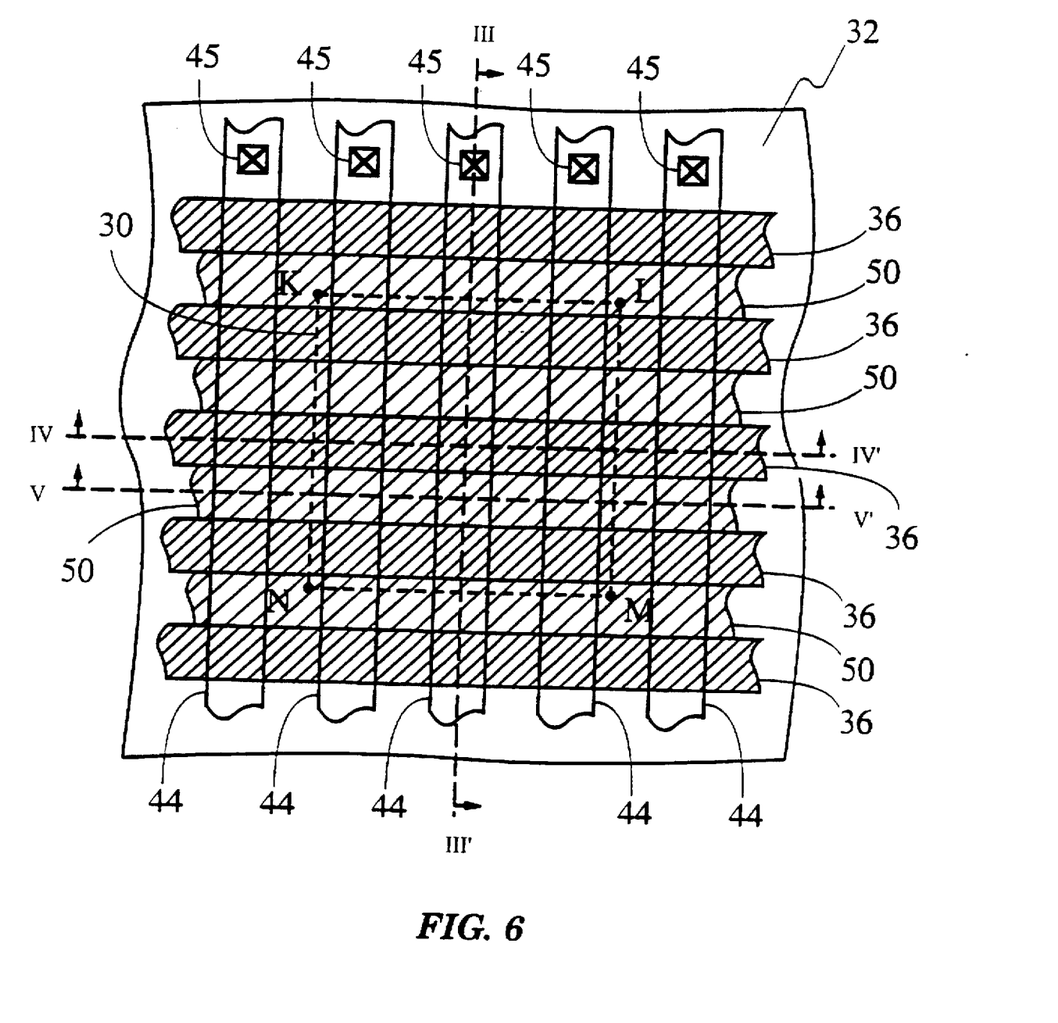
FIG. 6 is a simplified, two-dimensional overhead layout schematic view of the preferred embodiment of an MROM array structure according to the preferred embodiment of the present invention.
Figure 7A:
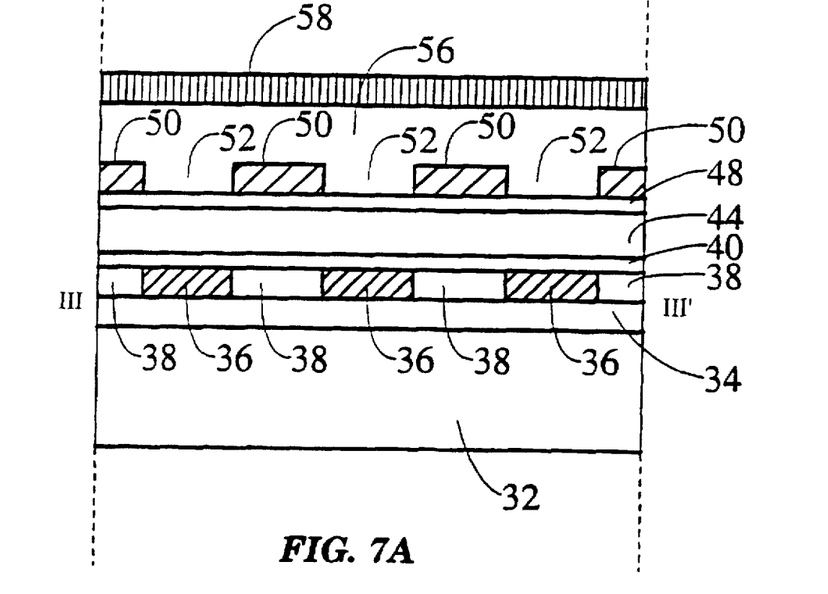
FIG. 7A through FIG. 7C are cross-sectional schematic views of a sub-region of the MROM array structure of FIG. 6 taken along the lines c-c', d-d', and e-e', respectively.
Figure 7B:
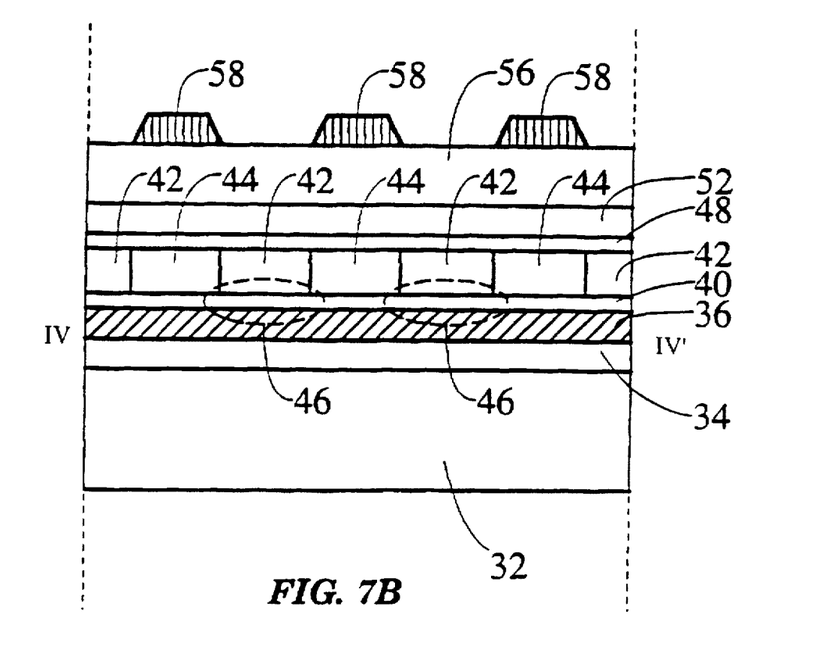
Figure 7C:
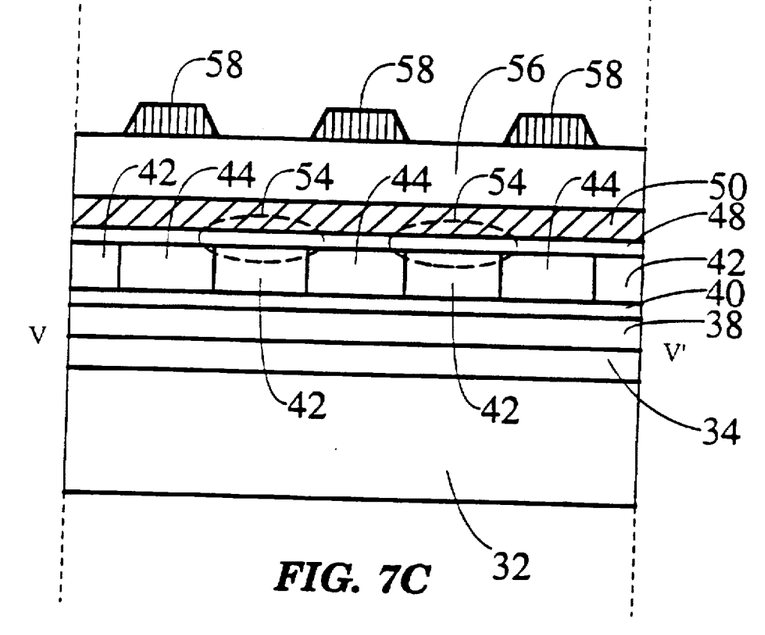
Figure 8:
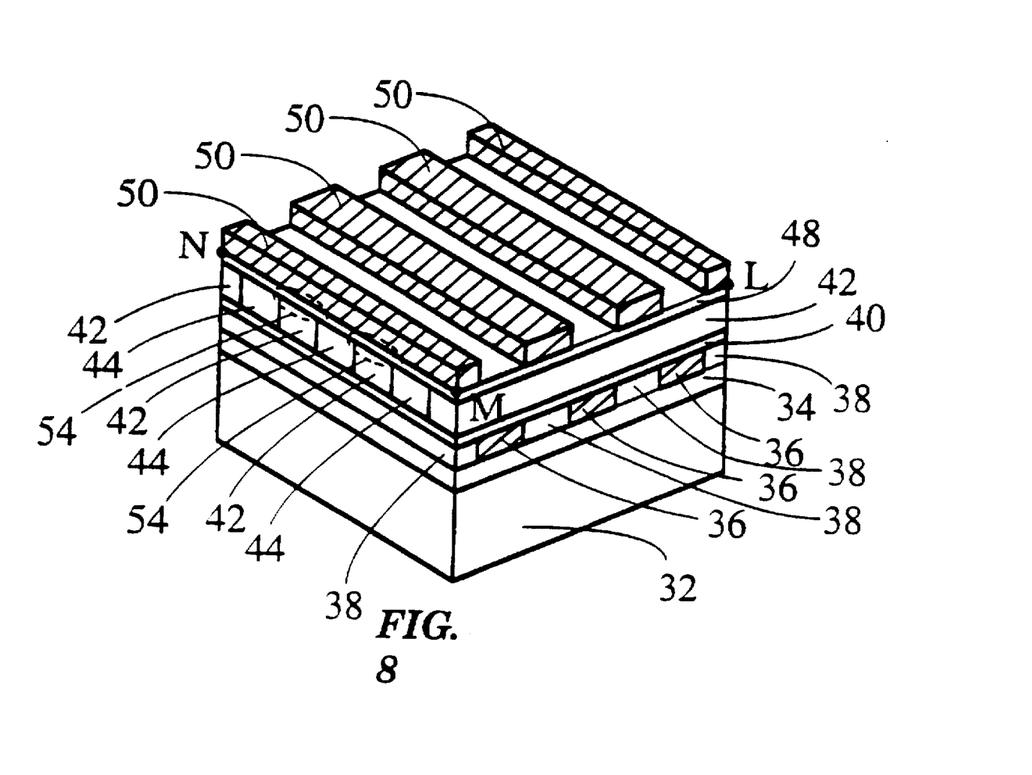
FIG. 8 is a simplified, three-dimensional cut-out schematic view of a sub-region of the MROM array structure of FIG. 6 according to the preferred embodiment of the present invention.

FIG. 6, is a simplified, two-dimensional overhead layout schematic view of a portion of the preferred embodiment of a double-density MROM array structure according to the present invention. FIG. 6 includes several memory cell unit areas, and it also includes a substantially rectangular sub-region 30 with vertices K, L, M, and N. FIG. 7A is a cross-sectional view of sub-region 30 of the MROM array structure of the present invention taken along the line c-c' of FIG. 6. Likewise, FIG. 7B is a cross-sectional view of sub-region 30 of the MROM array structure of the present invention taken along the line d-d' of FIG. 6. FIG. 7C is yet another cross-sectional view of sub-region 30 of the MROM array structure of the present invention. The cross-sectional view of FIG. 7C is taken along the line e-e' of FIG. 6. Finally, FIG. 8 is a three-dimensional cut-out view of sub-region 30 of the MROM array structure of the present invention that is shown in FIG. 6. The following description of the preferred embodiment of a double-density MROM array structure according to the present invention will now be given with reference to FIG. 6, FIG. 7A through 7C, and FIG. 9.

The preferred embodiment of an MROM array structure according to the present invention comprises a substrate 32, typically of a semiconductor material doped with impurities of a first conductivity type. Substrate 32 has a substantially flat, top surface, and in the preferred embodiment, substrate 32 is a wafer of single crystal, lightly doped, p-type silicon. A insulation layer 34 of field oxide covers the top surface of substrate 32, and predetermined, elongated strips of conductive polysilicon 36 extend over insulation layer 34. These conductive polysilicon strips 36 serve as bottom cell wordlines 36. Bottom cell wordlines 36 are electrically and physically isolated from each other by first isolation strips 38 of oxide.

The MROM array structure of the present invention also comprises a bottom gate dielectric 40 of oxide which covers bottom cell wordlines 36 and first isolation strips 38. Likewise, a layer of thin film polysilicon 42 completely covers bottom gate dielectric 40. Predetermined, elongated heavily-doped regions 44 are formed into thin film polysilicon 42. These heavily-doped regions 44 serve as conductive bitlines 44.

On the bottom surface of thin-film polysilicon 42, channel regions of thin film, bottom cell memory transistors 46 are formed directly above bottom cell wordlines 36 and between adjacent bitlines 44. Bitlines 44 serve as the source and drain electrodes for thin film, bottom cell memory transistors 46 whereas bottom cell wordlines 36 serve as gate electrodes for thin film, bottom cell memory transistors 46.

The MROM array structure of the present invention further comprises a top gate dielectric 48 of oxide which completely covers thin film polysilicon 42 and the bitlines 44 which have been formed into thin film polysilicon 42. In a manner similar to that of bottom cell wordlines 36, predetermined, elongated strips of conductive polysilicon 50 are formed over top gate dielectric 48. These conductive polysilicon strips 50 serve as top cell wordlines 50. Top cell wordlines 50 are electrically and physically isolated from each other by second isolation strips 50 of oxide. Additionally, top cell wordlines 50 are formed such that they are aligned directly above the first isolation strips 38, and the second isolation strips 52 are formed such that they are aligned directly above bottom cell wordlines 36.

On the top surface of thin film polysilicon 42, channel regions of thin film, top cell memory transistors 54 are formed directly below top cell wordlines 50 and between adjacent bitlines 44. Bitlines 44 serve as the source and drain electrodes for thin film, top cell memory transistors 54 whereas top cell wordlines 50 serve as gate electrodes for thin film, top cell memory transistors 54. Viewing the MROM array structure from above as in FIG. 6, top cell wordlines 50, bitlines 44, and bottom wordlines 36 form an array of alternating top and bottom cell memory transistors linking each adjacent bitline 44.

The preferred embodiment of an MROM array structure according to the present invention further comprises a third insulation layer 56 of oxide which covers both top cell wordlines 50 and second isolation strips 52. Finally, the MROM array structure comprises elongated metal strips 58 that are formed over third insulation layer 56. These metal strips 58 serve as metal bitlines 58, and metal bitlines 58 are formed such that they are aligned directly above bitlines 44. The MROM array structure also includes metal-to-diffusion contacts 45 which serve for electrically connecting metal bitlines 58 to diffusion bitlines 44. The placement of metal-to-diffusion contacts 45 is well understood in the art and will not be discussed herein.

By forming memory cell transistors on both the top and bottom surfaces of thin film polysilicon 42 in an alternating fashion, the MROM array structure of the present invention essentially doubles the storage density of a semiconductor NOR-type MROM compared to the storage density of conventional, prior art MROM array structures. Whereas only one memory cell transistor occupied a rectangular area ACEG in the prior art MROM array structure as shown in FIG. 1, the present invention allows for the inclusion of two memory cell transistors in this same rectangular area—one top cell memory transistor 54 and one bottom cell memory transistor 46. These transistors are formed on the top surface and bottom surface of thin film polysilicon 42, respectively. Also, the array structure of the present invention maintains the minimum spacing between wordlines necessary to allow reliable production of the MROM array structure. The minimum separation between adjacent wordlines continues to be determined by both the minimum feature size of the photolithographic process as well as by the out-diffusion of implanted ions during the code mask programming step. In other words, the channels of top cell memory transistors 54 are placed as closely together as allowed by the photolithographic process, and the channels of bottom cell memory transistors 46 are also placed as closely together as allowed by the photolithographic process. However, since the MROM array structure of the present invention includes both top cell and bottom cell transistors, the effective number of memory cells per semiconductor unit area is essentially doubled.

A method for producing the preferred embodiment of a semiconductor double density MROM array structure according to the present invention will now be described. The following description will make reference to FIG. 9A through FIG. 9F in order to illustrate the sequence of steps in the method. These drawings illustrate the main processing steps of the fabrication process.

Like FIG. 7A, FIGS. 9A, 9B, 9C, and 9E are cross-sectional views of sub-region 30 of the preferred embodiment of the MROM array structure of the present invention taken along the line c-c' of FIG. 6. Like FIG. 7B, FIG. 9D is a cross-sectional view of sub-region 30 of the preferred embodiment of the MROM array structure of the present invention taken along the line d-d' of FIG. 6. FIG. 9D illustrates the steps involved in programming the bottom cell memory transistors 46. Finally, like FIG. 7C, FIG. 9F is a cross-sectional view of sub-region 30 of the preferred embodiment of the MROM array structure of the present invention taken along the line e-e' of FIG. 6. FIG. 9F illustrates the steps involved in programming the top cell memory transistors 54.

Figure 9A:
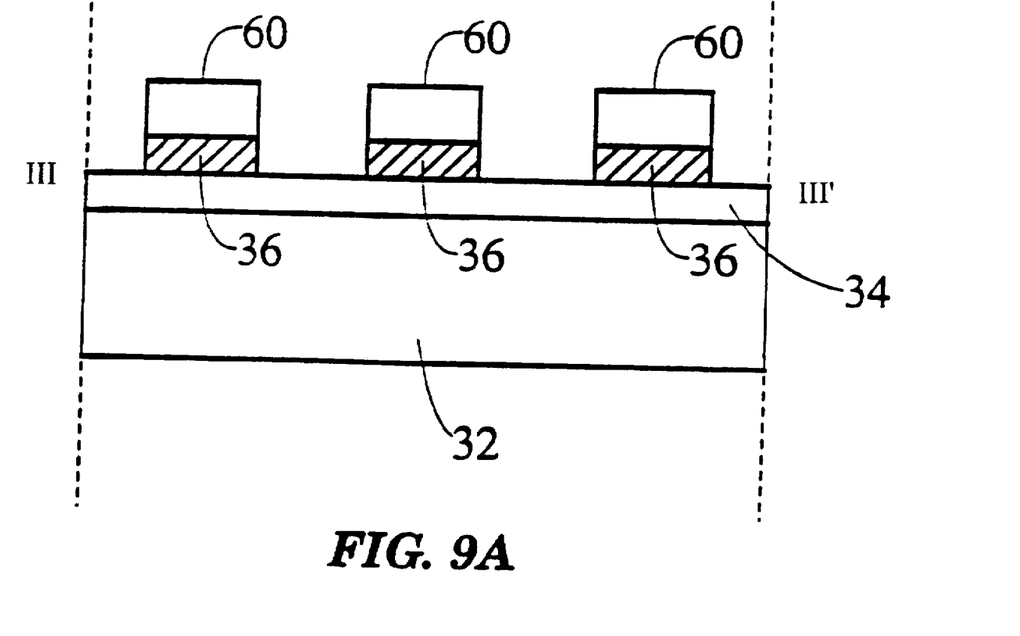
FIG. 9A through 9F are cross-sectional schematic views of a sub-region of the MROM array structure of FIG. 6 illustrating the major processing steps in the fabrication of the preferred embodiment of the present invention.
Figure 9B:
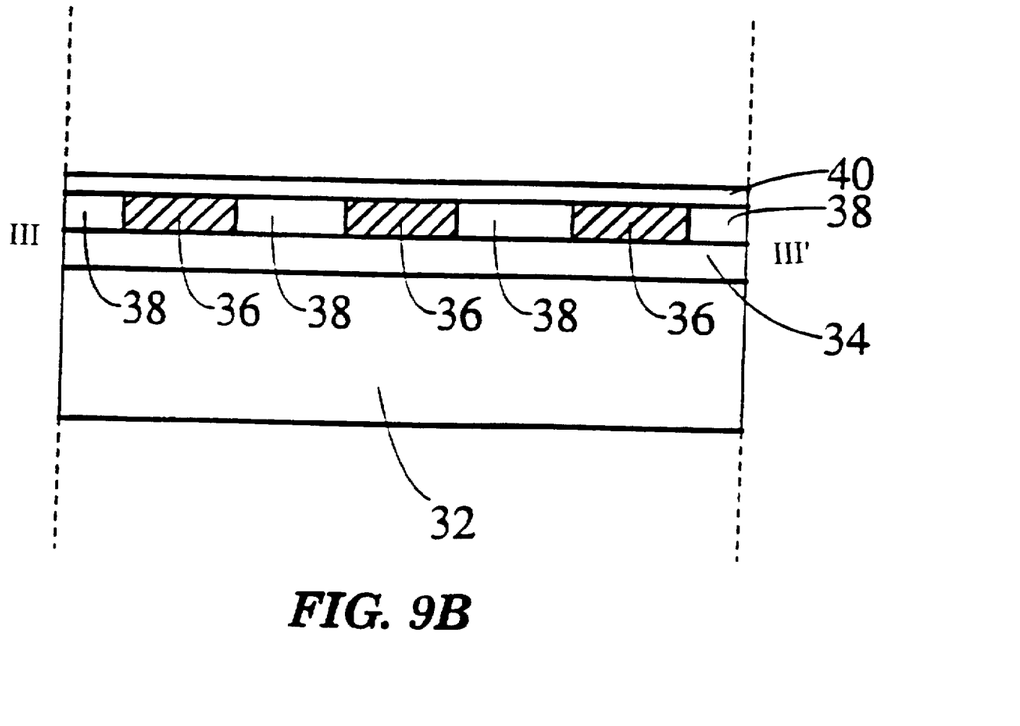

Referring now to FIG. 9A, in the first step of a fabrication process for fabricating the preferred embodiment of a double-density MROM array structure according to the present invention, a p-type silicon substrate 32 is subjected to a thermal oxidation step, as is well understood in the art, in order to grow a layer of insulating field oxide 34 thereon. Using chemical vapor deposition (CVD), a layer of polysilicon is then deposited over field oxide 32. Impurities are typically added to the CVD vapor during this deposition such that the resulting polysilicon film will have a low resistivity. Following this step, a plurality of strips of a first photoresist 60 are deposited in a predetermined pattern over the top surface of the layer of deposited polysilicon. Several methods for depositing first photoresist 60 over the polysilicon are well understood in the art and will not be further described herein. The predetermined pattern of photoresist 60 covers only the portions of the polysilicon that will be used as bottom cell wordlines 36. The structure is then subjected to an etching step which removes substantially all the deposited polysilicon which is not covered by photoresist 60. This etching step produces the structure of FIG. 9A. Since etching techniques are well understood in the art, they will not be described herein.

After stripping first photoresist 60 from the structure, the structure is subjected to another oxidation step (thermal or CVD) wherein a first isolation oxide 38 is grown in strips between bottom cell wordlines 36. First isolation oxide 38 may partially grow over bottom cell wordlines 36. Additionally, the top surface of first isolation oxide 38 will typically be uneven. Therefore, the structure is then subjected to an etch-back step in order to planarize the surface of the structure, thereby exposing both the top surfaces of the bottom cell wordlines 36 as well as the top surfaces of the strips of first isolation oxide 38. Upon completion of this planarization step, a thin layer of bottom gate oxide 40 is grown over the entire structure, thereby producing the structure of FIG. 9B.

Again using chemical vapor deposition (CVD), a layer of thin film polysilicon 42, typically 2500-3000 angstroms thick, is then deposited over bottom gate oxide 40. Since this thin film polysilicon 42 will provide the channel regions of the top and bottom cell memory transistors, 54 and 46, respectively, fewer impurities are typically added to the CVD vapor during this deposition such that the resulting polysilicon film will have a moderate resistivity. Following this step, photoresist is once again deposited over the structure in a predetermined pattern, and the structure is subjected to an arsenic (or phosphorus) ion implantation step. The photoresist pattern allows these dopant ions to implant only into predetermined regions of thin film polysilicon 42. The implanted ions heavily dope these predetermined regions, thereby forming the conductive strips of diffusion that serve as bitlines 44. Bitlines 44 extend in a direction substantially perpendicular to that of bottom cell wordlines 36. The photoresist is then stripped from the structure, and a thin layer of top gate oxide 48 is grown over the thin film polysilicon 42 and bitlines 44, thereby producing the structure of FIG. 9C.

Figure 9C:
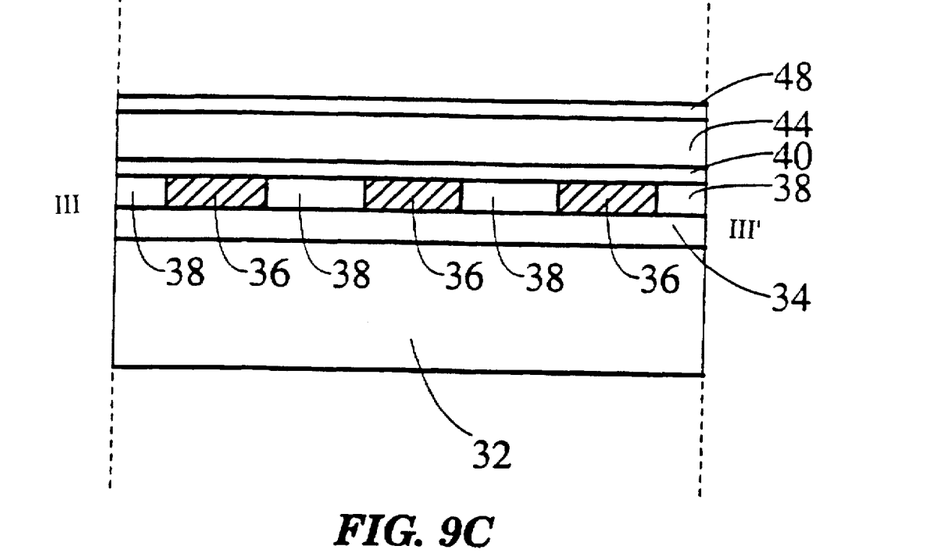
Figure 9D:
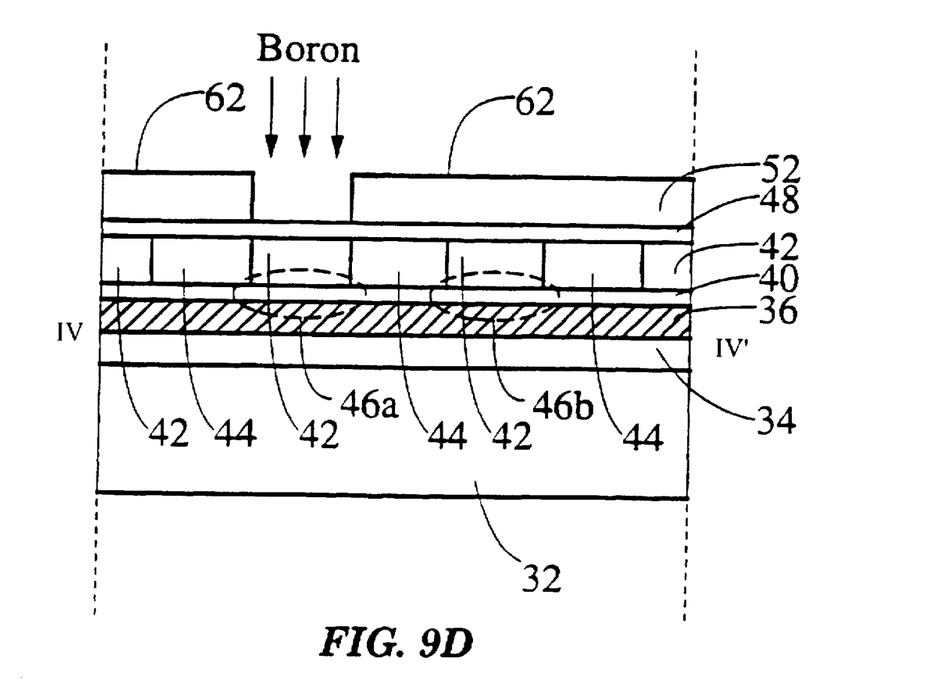

At this point in the fabrication process, the thin film, bottom cell memory transistors 46 have been formed in the structure. The channel regions of bottom cell memory transistors 46 are formed on the bottom surface of thin film polysilicon 42 in regions that lie directly above bottom cell wordlines 36 and directly between any two adjacent bitlines 44. Bottom cell memory transistors 46 are NMOS transistors, and they can now be programmed to store data information by using a code mask and an ion implantation step as follows.

Referring to FIG. 9D, another photoresist 62 is patterned over the surface of the top gate oxide 48. This photoresist 62 serves as the code mask for the thin film, bottom cell memory transistors 46, and it covers the entire structure except areas directly above the channel regions of the bottom cell memory transistors 46 which need to be programmed. The structure is then subjected to a boron ion implantation step wherein boron ions with an energy of about 120 keV are directed towards the top surface of the structure. Boron ions pass through the windows in photoresist 62 and into the structure where they become lodged near the bottom surface of thin film polysilicon 42, thereby doping the channel regions of the appropriate bottom cell memory transistors 46. Since boron is a p-type dopant, the threshold voltages of these bottom cell memory transistors 46 increases. This higher threshold voltage represents a data bit different from that represented by the lower, nominal threshold voltage of bottom cell memory transistors whose channel regions are protected from the boron ions by photoresist 62. In FIG. 9D, the channel region of bottom cell memory transistor 46a is not covered by photoresist 62 in this step such that this transistor is programmed to have the higher threshold voltage. By contrast, the channel region of bottom cell memory transistor 46b is covered by photoresist 62 in this step such that it retains the lower, nominal threshold voltage.

After programming the bottom cell memory transistors 46, photoresist 62 is stripped from the structure, and using chemical vapor deposition, a second layer of polysilicon is then deposited over top gate oxide 48. Once again, impurities are typically added to the CVD vapor during this deposition such that the resulting polysilicon film will have a low resistivity. Following this step, a plurality of strips of a still another photoresist 64 are deposited in a predetermined pattern over the top surface of the newly-deposited polysilicon. The structure is then subjected to an etching step which removes substantially all the newly-deposited polysilicon which is not covered by photoresist 60, thereby producing the structure of FIG. 9E.

Figure 9E:
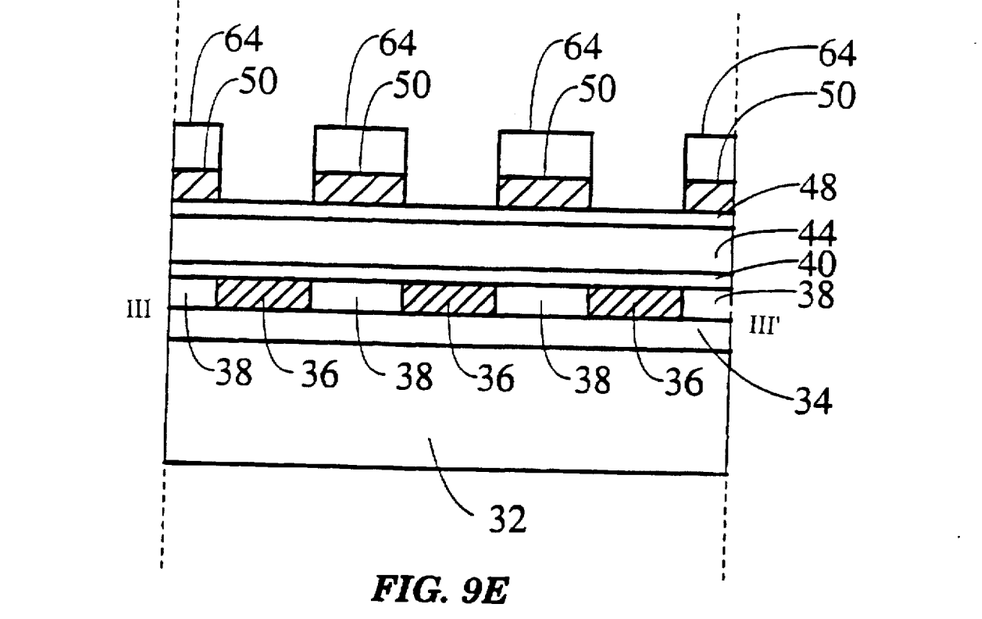
Figure 9F:
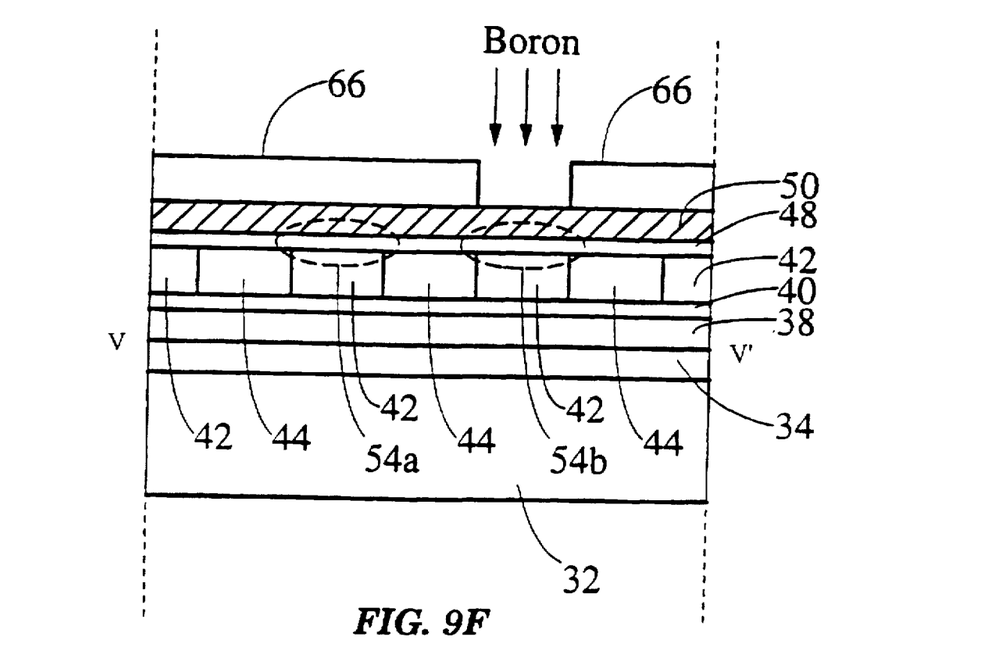

The predetermined pattern of photoresist 64 covers only the regions of the newly-deposited polysilicon that will be used as top cell wordlines 50. Top cell wordlines 50 extend in strips in a direction substantially perpendicular to that of bitlines 44 and substantially parallel to bottom cell wordlines 36. Furthermore, top cell wordlines 50 are placed substantially directly above the strips of first isolation oxide 38. In this way, when viewed from above, top cell wordlines 50 and bottom cell wordlines 36 form alternating, parallel strips.

After stripping the photoresist 64 from the structure, the is structure is subjected to yet another oxidation step (thermal or CVD) wherein strips of a second isolation oxide 52 are grown between top cell wordlines 50, substantially directly above bottom wordlines 36. The structure is then subjected to another etch-back step in order to planarize the surface of the structure, thereby exposing a smooth, planar surface comprising both the top surfaces of the top cell wordlines 50 as well as the top surfaces of the strips of second isolation oxide 52.

At this point in the fabrication process, the thin film top cell memory transistors 54 have been formed in the structure. The channel regions of top cell memory transistors 54 are formed on the top surface of thin film polysilicon 42 in regions that lie directly below top cell wordlines 50 and directly between any two adjacent bitlines 44. Top cell memory transistors 54 are NMOS transistors, and they can now be programmed to store data information by using a second code mask and a second ion implantation step as follows.

Referring to FIG. 9F, another photoresist 66 is patterned over the surface of the structure. This photoresist 66 serves as the code mask for the thin film, top cell memory transistors 54, and it covers the entire structure except areas directly above the channel regions of the top cell memory transistors 54 which need to be programmed. The MROM structure is then subjected to another boron ion implantation step wherein boron ions with an energy of about 50–70 keV are directed towards the top surface of the structure. Boron ions pass through the windows in photoresist 66 and into the MROM structure where they become lodged near the top surface of thin film polysilicon 42, thereby doping the channel regions of the top cell memory transistors 54. Since boron is a p-type dopant, the threshold voltages of these top cell memory transistors 54 increases. This higher threshold voltage represents a data bit different from that of the lower, nominal threshold voltage of top cell memory transistors whose channel regions are protected from the boron ions by photoresist 66. In FIG. 9F, the channel region of thin film, top cell memory transistor 54a is covered by photoresist 66 in this step such that it retains the lower, nominal threshold voltage. However, the channel region of thin film, top cell memory transistor 54b is not covered by photoresist 66 in this step such that it is programmed to have the higher threshold voltage.

In the preferred embodiment, the placement of the top cell wordlines 50 relative to the bottom cell wordlines 36 helps prevent unintentional, incorrect programming of the memory cell transistors that should retain the lower, nominal threshold voltage. During top cell and bottom cell code implantation steps, the ion beams directed at the MROM structure contain individual ions with a distribution of energies above and below the nominal ion energy of 50–70 keV and 120 keV. Therefore, during the first code implantation step, some ions do not penetrate all the way through thin film polysilicon 42 to the channel regions of bottom cell memory transistors 46. Some ions remain lodged near the top surface of thin film polysilicon 42. Likewise, during the second code implantation step, some ions penetrate beyond the top surface of thin film polysilicon 42 where the channel regions of top cell memory transistors 54 are located. Some ions penetrate all the way to the bottom surface of thin film polysilicon 42. If the channel regions of top cell memory transistors 54 where placed directly above the channel regions of the bottom cell memory transistors 46, these stray ions could cause incorrect programming of the memory cell transistors.

Another way to avoid the potential problem of incorrectly programming the memory cell transistors is to make thin film polysilicon thicker, requiring the use of a greater difference in ion implantation energies for the two code implantation steps. In this way, top cell wordlines 50 might be placed directly above bottom cell wordlines 36.

After removing photoresist 66 from the MROM structure of FIG. 9F, the preferred embodiment of the MROM array structure according to the present invention is subjected to a few post-processing steps. The post processing steps typically include but are not limited to the formation of metal-to-diffusion contacts 45, the deposition of a third insulating oxide 56 (typically boron-phosphorus silicate glass, or BPSG), and the deposition of metal bitlines 58. Still further post-processing steps may include the formation of other contact windows, additional metalization, additional passivation, and packaging.

Many modifications of the preferred embodiment are possible without exceeding the scope of the present invention, and many of these would be obvious to those skilled in the art. For example, the thin film memory cell transistors could be PMOS transistors and an n-type dopant such as arsenic or phosphorus could be used in the code implantation steps to produce lower thresholds in order to code the data information into the memory cells. In addition, certain details of the present description can be changed in obvious ways without altering the function or results of the essential ideas of the invention. For example, the MROM array structure could be made on p-type silicon or the insulating oxides could be made from other insulating materials. Therefore, although the invention has been described in connection with the preferred embodiment, it will be understood that this description is not intended to limit the invention thereto, but the invention is intended to cover all modifications and alternative constructions falling within the spirit and scope of the invention as expressed in the appended claims and their legal equivalents.

We claim:

1. A method for fabricating a mask-programmable read-only-memory array structure for storing data information in high density, the method comprising the steps of:

a) forming an insulation layer over a top surface of a substrate;

b) depositing a first layer of polysilicon over said insulation layer;

c) selectively etching said first layer of polysilicon to form a plurality of substantially parallel, elongated, conductive bottom cell wordlines positioned adjacent to one another at intervals;

d) growing a plurality of insulation strips between said bottom cell wordlines;

e) etching back said plurality of insulation strips and said plurality of bottom cell wordlines to form substantially coplanar top surfaces of said bottom cell wordlines and said insulation strips;

f) growing a bottom gate dielectric over said coplanar top surfaces of said bottom cell wordlines and said insulation strips;

g) depositing a layer of thin film polysilicon over said bottom gate dielectric;

h) forming a plurality of substantially parallel, elongated, heavily-doped regions in said thin film polysilicon, said heavily-doped regions being positioned adjacent to one another at intervals, and said heavily-doped regions forming conductive bitlines, said bitlines extending substantially perpendicular to said bottom cell wordlines thereby forming a plurality of bottom cell memory transistors, said bottom cell memory transistors having said bottom cell wordlines are gate electrodes and having channel regions on a bottom surface of said thin film polysilicon;

i) depositing a top gate dielectric over a top surface of said thin film polysilicon;

j) depositing a second layer of polysilicon over said top gate dielectric; and k) selectively etching said second layer of polysilicon to form a plurality of substantially parallel, elongated, conductive top cell wordlines positioned adjacent to one another at intervals, said plurality of top cell wordlines extending substantially perpendicular to said bitlines thereby forming a plurality of top cell memory transistors, said top cell memory transistors having said top cell wordlines as gate electrodes and having channel regions on said top surface of said thin film polysilicon.

2. A method for fabricating a read-only-memory array structure according to claim 1, wherein said insulation layer, said insulation strips, said bottom gate dielectric, and said top gate dielectric are of silicon dioxide, $SiO_2$.

3. A method for fabricating a read-only-memory array structure according to claim 2, wherein said substrate is p-type silicon.

4. A method for fabricating a read-only-memory array structure according to claim 1, wherein said thin film polysilicon is deposited to a thickness of 2500–3000 angstroms.

5. A method for fabricating a read-only-memory array structure according to claim 4, wherein said bottom cell memory transistors and said top cell memory transistors are NMOS transistors.

6. A method for fabricating a read-only-memory array structure according to claim 5, wherein the step of forming a plurality of heavily-doped regions in said thin film polysilicon is accomplished by the selective implantation of arsenic ions into said thin film polysilicon.

7. A method for fabricating a read-only-memory array structure according to claim 6, wherein the step of selectively etching said first layer of polysilicon, the step of selectively implanting arsenic ions into said thin film polysilicon, and the step of selectively etching said second layer of polysilicon are accomplished using photoresist.

8. A method for fabricating a read-only-memory array structure according to claim 6, wherein the step of depositing said first layer of polysilicon, the step of depositing said thin film polysilicon, and the step of depositing said second layer of polysilicon are accomplished using chemical vapor deposition.

9. A method for fabricating a read-only-memory array structure according to claim 1, wherein the step of selectively etching said second layer of polysilicon is carried out such that said top cell wordlines are not positioned directly above said bottom cell wordlines, thereby preventing the channel regions of said top cell memory transistors from lying directly above the channel regions of said bottom cell memory transistors, thereby producing an array structure wherein top cell memory transistors and bottom cell memory transistors link adjacent bitlines in an alternating fashion.

* * * * *

UNITED STATES PATENT AND TRADEMARK OFFICE
CERTIFICATE OF CORRECTION

PATENT NO. : 5,893,738
DATED : April 13, 1999
INVENTOR(S) : Chung-Ju Chen, et al.

It is certified that error appears in the above-indentified patent and that said Letters Patent is hereby corrected as shown below:

In Col. 3, line 43, delete "a-a'" and insert therefore -- I-I' --.

In Col. 3, line 45, delete "b-b'" and insert therefore -- II-II' --.

In Col. 6, line 43, delete "a-a'" and insert therefore -- I-I' --.

In Col. 6, line 46, delete "b-b'" and insert therefore -- II-II' --.

In Col. 6, line 55, delete "c-c'" and insert therefore -- III-III' --.

In Col. 6, line 55, delete "d-d'" and insert therefore -- IV-IV' --.

In Col. 6, line 55, delete "e-e'" and insert therefore -- V-V' --.

In Col. 7, line 29, delete "c-c'" and insert therefore -- III-III' --.

In Col. 7, line 32, delete "d-d'" and inser thereforet -- IV-IV' --.

In Col. 7, line 35, delete "e-e'" and insert therefore -- V-V' --.

In Col. 9, line 15, delete "c-c'" and insert therefore -- III-III' --.

In Col. 9, line 18, delete "d-d'" and insert therefore -- IV-IV' --.

UNITED STATES PATENT AND TRADEMARK OFFICE
CERTIFICATE OF CORRECTION

PATENT NO. : 5,893,738
DATED : April 13, 1999
INVENTOR(S) : Chung-Ju Chen, et al.

It is certified that error appears in the above-indentified patent and that said Letters Patent is hereby corrected as shown below:

In Col. 9, line 23, delete "e-e'" and insert therefore -- V-V' --.

Signed and Sealed this

Fifth Day of October, 1999

Attest:

Q. TODD DICKINSON

*Attesting Officer*  *Acting Commissioner of Patents and Trademarks*